(12) United States Patent
Hamilton et al.

(10) Patent No.: US 11,233,030 B1
(45) Date of Patent: Jan. 25, 2022

(54) MICROFLUIDIC MANUFACTURED MESOSCOPIC MICROELECTRONICS INTERCONNECT

(71) Applicant: Rockwell Collins, Inc., Cedar Rapids, IA (US)

(72) Inventors: Brandon C. Hamilton, Marion, IA (US); Kyle B. Snyder, Marion, IA (US); Alan P. Boone, Swisher, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 15/639,932

(22) Filed: Jun. 30, 2017

(51) Int. Cl.
*H01L 23/00* (2006.01)
*H01L 25/065* (2006.01)
*H01L 25/00* (2006.01)

(52) U.S. Cl.
CPC ............. *H01L 24/48* (2013.01); *H01L 24/73* (2013.01); *H01L 24/85* (2013.01); *H01L 24/92* (2013.01); *H01L 25/0657* (2013.01); *H01L 25/50* (2013.01); *H01L 2224/4807* (2013.01); *H01L 2224/4809* (2013.01); *H01L 2224/48101* (2013.01); *H01L 2224/48106* (2013.01); *H01L 2224/48227* (2013.01); *H01L 2224/48997* (2013.01); *H01L 2224/48998* (2013.01); *H01L 2224/73215* (2013.01); *H01L 2224/73265* (2013.01); *H01L 2224/85007* (2013.01); *H01L 2224/92247* (2013.01); *H01L 2225/0651* (2013.01)

(58) Field of Classification Search
CPC ......... H01L 24/48; H01L 24/85; H01L 24/73; H01L 24/92; H01L 25/50; H01L 25/0657; H01L 23/13; H01L 23/3171; H01L 23/3185
See application file for complete search history.

(56) References Cited

U.S. PATENT DOCUMENTS

| | | | | |
|---|---|---|---|---|
| 2003/0102567 A1* | 6/2003 | Eskildsen | ............. | H01L 21/561 257/777 |
| 2003/0193545 A1* | 10/2003 | Boucher | ............. | B41J 2/14072 347/50 |
| 2004/0173892 A1* | 9/2004 | Nakanishi | ............ | H01L 23/5389 257/690 |
| 2006/0049527 A1* | 3/2006 | Hashimoto | ............. | H01L 23/13 257/773 |
| 2012/0080796 A1* | 4/2012 | Wada | ................ | H01L 21/76834 257/762 |
| 2012/0313264 A1* | 12/2012 | Sato | ........................ | H01L 23/13 257/783 |

(Continued)

Primary Examiner — Allen L Parker
Assistant Examiner — Gustavo G Ramallo
(74) Attorney, Agent, or Firm — Suiter Swantz pc llo

(57) ABSTRACT

An electrical device with printed interconnects between packaged integrated circuit components and a substrate as well as a method for printing interconnects between packaged integrated circuit components and a substrate are disclosed. An electrical device with printed interconnects may include a dielectric layer forming a continuous surface between a substrate and a terminal face of an integrated circuit component. The electrical device may further include interconnects formed from a layer of material printed across the continuous surface formed by the dielectric layer to connect electrical terminals on the substrate to electrical terminals on the terminal face of the integrated circuit component.

20 Claims, 6 Drawing Sheets

(56) References Cited

U.S. PATENT DOCUMENTS

2016/0064365 A1* 3/2016 Jang ................... H01L 25/18
　　　　　　　　　　　　　　　　　　　257/777
2017/0154867 A1* 6/2017 Sriram ................. H01L 24/83

* cited by examiner

US 11,233,030 B1

MICROFLUIDIC MANUFACTURED MESOSCOPIC MICROELECTRONICS INTERCONNECT

BACKGROUND

Multi-chip module (MCM) devices may be fabricated with three-dimensional (3D) packaging geometries to provide functional density and a relatively small footprint. However, long design cycles, die obsolescence, and a limited number of substrate suppliers may constrain 3D MCM device design. Further, physical considerations such as limited printed wiring board (PWB) geometries as well as demand for high input/output (I/O), small-pitch commercial-off-the-shelf (COTS) integrated circuit (IC) component integration into MCM devices may present additional challenges for 3D MCM design. In particular, the design and fabrication of electrical interconnects between stacked ICs and substrate layers may limit the selection of COTS components suitable for 3D packaging geometries as well as the vertical and horizontal densities of components within MCM devices.

SUMMARY

In one aspect, embodiments of the inventive concepts disclosed herein are directed to an electrical device including a substrate, an integrated circuit component mounted to the substrate, and a printed interconnect. The printed interconnect may be formed from a layer of material to provide an electrical connection between an electrical terminal on the substrate and an electrical terminal on a terminal face of the integrated circuit component. The printed interconnect may further be printed across a dielectric layer that forms a continuous surface between the substrate and the terminal face of the integrated circuit component.

In a further aspect, embodiments of the inventive concepts disclosed herein are directed to an electrical device including a substrate, multiple integrated circuit components separated by insulating stack layers forming a stack that is mounted to the substrate, and a printed interconnect formed from a layer of material to provide an electrical connection between an electrical terminal on a substrate and an electrical terminal on a terminal face of an integrated circuit component of the stack. The printed interconnect may further be printed across a dielectric layer that forms a continuous surface between the substrate and the terminal face of the integrated circuit component of the stack.

In a further aspect, embodiments of the inventive concepts disclosed herein are directed to a method for fabricating electrical devices with printed interconnects. The method may include mounting an integrated circuit component to a substrate, fabricating a dielectric layer around a perimeter of the integrated circuit component to form a continuous surface between the substrate and a terminal face of the integrated circuit component, and printing an interconnect with a layer of material between a terminal on the substrate and a terminal on the terminal face of the integrated circuit component. The printed interconnect may further be printed across a dielectric layer that forms a continuous surface between the substrate and the terminal face of the integrated circuit component.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

Implementations of the inventive concepts disclosed herein may be better understood when consideration is given to the following detailed description thereof. Such description makes reference to the included drawings, which are not necessarily to scale, and in which some features may be exaggerated and some features may be omitted or may be represented schematically in the interest of clarity. Like reference numerals in the drawings may represent and refer to the same or similar element, feature, or function. In the drawings.

DETAILED DESCRIPTION

Figure 1A:
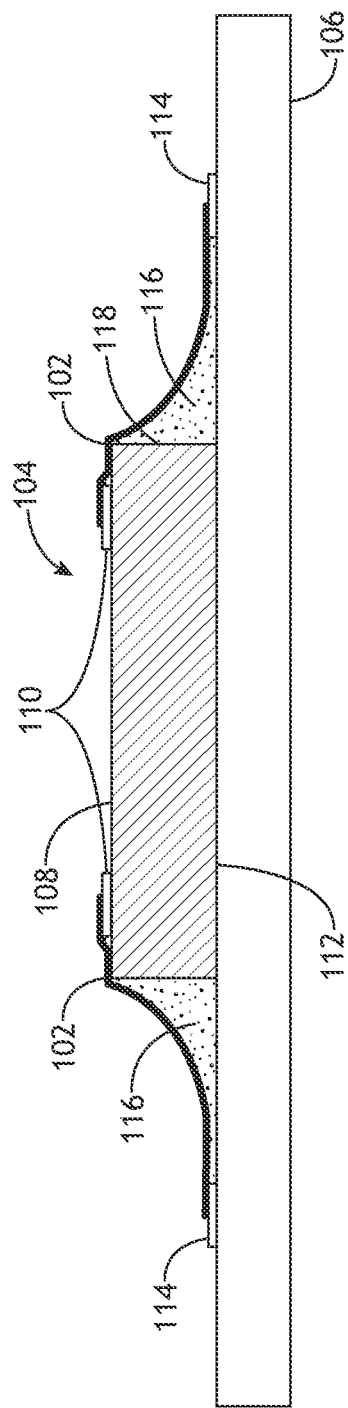
FIG. 1A is a profile view of an exemplary embodiment of an electrical device with printed interconnects configured in accordance with one or more embodiments of the inventive concepts disclosed herein.

Before explaining at least one embodiment of the inventive concepts disclosed herein in detail, it is to be understood that the inventive concepts are not limited in their application to the details of construction and the arrangement of the components or steps or methodologies set forth in the following description or illustrated in the drawings. In the following detailed description of embodiments of the instant inventive concepts, numerous specific details are set forth in order to provide a more thorough understanding of the inventive concepts. However, it will be apparent to one of ordinary skill in the art having the benefit of the instant disclosure that the inventive concepts disclosed herein may be practiced without these specific details. In other instances, well-known features may not be described in detail to avoid unnecessarily complicating the instant disclosure. The inventive concepts disclosed herein are capable of other embodiments or of being practiced or carried out in various ways. Also, it is to be understood that the phraseology and terminology employed herein is for the purpose of description and should not be regarded as limiting.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only, and should not be construed to limit the inventive concepts disclosed herein in any way unless expressly stated to the contrary.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of embodiments of the instant inventive concepts. This is done merely for convenience and to give a general sense of the inventive concepts, and "a" and "an" are intended to include one or at least one and the singular also includes the plural unless it is obvious that it is meant otherwise.

Finally, as used herein any reference to "one embodiment," or "some embodiments" means that a particular element, feature, structure, or characteristic described in connection with the embodiment is included in at least one embodiment of the inventive concepts disclosed herein. The appearances of the phrase "in some embodiments" in various places in the specification are not necessarily all referring to the same embodiment, and embodiments of the inventive concepts disclosed may include one or more of the features expressly described or inherently present herein, or any combination of sub-combination of two or more such features, along with any other features which may not necessarily be expressly described or inherently present in the instant disclosure.

Reference will now be made in detail to exemplary embodiments of the inventive concepts disclosed herein, examples of which are illustrated in the accompanying drawings.

Embodiments in accordance with the inventive concepts disclosed herein are directed to printing electrical interconnects between packaged IC components and a substrate. Electrical interconnects may include a layer of electrically conductive material printed between electrical terminals of a substrate layer and electrical terminals of an IC component mounted to the substrate. In this regard, the interconnects may provide electrical connections between elements of an IC component and a substrate to form a functional device. Further, interconnects configured in accordance with inventive concepts disclosed herein may be fabricated with an additive or microfluidic process suitable for mesoscale microelectronics applications.

The substrate may be any type of substrate suitable for accepting IC components and providing electrical terminals for printed interconnects. For example, the substrate may include a PWB with electrical circuitry and terminals for providing electrical connections to the integrated circuit components. The substrate may further be formed from any material such as, but not limited to, a glass epoxy, laminate, ceramic, or a composite inorganic material. Additionally, the substrate may be flexible or rigid.

An integrated circuit component may be any type of packaged circuitry suitable for integration into an electronic device including COTS components or custom packaged components. For example, the IC component may include internal electrical components mounted on an internal substrate and packaged to include electrical terminals to provide electrical connections to the various internal electrical components. The packaging of an IC component may further provide physical support and electrical isolation for the internal electrical components.

In this regard, an IC component may be designed to perform one or more selected functions when integrated within a larger electrical device such as, but not limited to, signal processing functions, filtering functions, switching functions, or timing functions. Further, a MCM device may include any number of IC components arranged separately or in a stacked configuration. For example, a MCM device may include a stack of IC components (e.g. an IC stack) separated by insulating stack layers for insulating electrical terminals between IC components and/or physically securing the IC components together.

Interconnects fabricated in accordance with inventive concepts disclosed herein may be printed using any printing technology known in the art. For example, an interconnect may be fabricated using an additive manufacturing technique (sometimes referred to as 3D printing) in which a conductive material is selectively deposited onto the device in a desired pattern in one or more layers to build up the interconnect.

In some embodiments, interconnects are printed using a non-contact jet process in which a conductive material is atomized and projected via a projection head (e.g. a gas nozzle) to a surface of the device. In this regard, the conductive material may be selectively deposited in a desired pattern by translating the sample and/or a projection assembly. For example, an interconnect printed using a non-contact jet process may have, but is not required to have, a height and/or width on the order of tens of micrometers or less. Further, multiple projection heads may simultaneously print interconnects on the device.

In some embodiments, interconnects are printed using an inkjet printing process in which a layer of powder is deposited on at least a portion of the surface to be printed on and a liquid binding material is selectively deposited on the powder using an inkjet print head in a desired pattern. The unbound powder may then be removed such that the desired interconnect pattern remains. Further, any combination of the powder and the binding material may be electrically conductive such that the printed interconnect is electrically conductive.

In some embodiments, interconnects are printed with an extrusion process such as, but not limited to, a fused deposition modeling (FDM) process in which molten conductive material is directed through a deposition head (e.g. an extrusion nozzle) towards the surface and then cools on the surface to form the interconnect.

In some embodiments, interconnects are printed with a laser-based additive manufacturing process such as, but not limited to, stereolithography or selective laser sintering in which a focused laser fuses or cures electrically conductive material to form the interconnect.

Interconnects may be formed from any material or combination of materials suitable for providing a printed electrical pathway such as, but not limited to, gold, silver, aluminum, platinum, nickel, titanium, tungsten, or carbon. In some embodiments, interconnects are formed from liquid semiconductor materials such as, but not limited to, conjugated dienes or poly(3,4-ethylenedioxythiophene) (PEDOT). In some embodiments, interconnects are formed from nanoparticulate inks (e.g. metallic nanoparticle inks or carbon nanoparticle inks). In some embodiments, interconnects are formed from a paste (e.g. a conductive paste). Further, printed interconnects may be fabricated with any electrical conductance or resistance. For example, printed interconnects formed from materials having a relatively high electrical conductance (e.g. formed from silver nanoparticles) may be function as wiring elements between components. By way of another example, printed interconnects formed from materials having a relatively high electrical resistance (e.g. formed from a carbon black or graphene) may function as resistive elements suitable for signal transmission or as resistors.

In some embodiments, an electronic device fabricated in accordance with inventive concepts disclosed herein may include electrical interconnects fabricated using multiple methods. For example, an electronic device fabricated in accordance with inventive concepts disclosed herein may include, but is not required to include, one or more printed interconnects (e.g. fabricated using a non-contact jet process) and one or more additional interconnects fabricated using an alternative process such as, but not limited to, wire bonding, solder sphere interconnects, gold-to-gold interconnects (GGI), anisotropic conductive film (ACF) interconnects, or anisotropic conductive paste (ACP) interconnects.

Embodiments in accordance with the inventive concepts disclosed herein are further directed to fabricating a dielectric layer to provide a continuous surface between the substrate and a face of an IC component including electrical contacts (e.g. a terminal face). In this regard, a dielectric layer may provide a continuous surface suitable for accepting printed interconnects. Further, the dielectric layer may be formed from a non-conductive material to provide electrical isolation for printed interconnects.

The dielectric layer may further reduce a height differential between a terminal face of an IC component and a substrate layer having electrical terminals. For example, design specifications (e.g. based on limitations of the printing process or structural specifications intended to provide a desired level of performance) may provide limitations on a maximum allowable vertical step height or a maximum inclination angle along a path of a printed interconnect. Accordingly, the dielectric layer may provide a surface suitable for printing interconnects within desired design specifications. In one instance, a dielectric layer is provided around at least a portion of the perimeter of an IC component having a sidewall extending normal to the substrate to provide a continuous surface with a desired surface profile from a terminal face of the IC component to the substrate.

The dielectric layer may be fabricated with any process suitable for creating a desired surface profile between the substrate and a terminal face of an IC component. In some embodiments, the dielectric layer is fabricated using a printing process as described previously herein. For example, interconnects and dielectric layers may be printed in simultaneous or sequential printing steps. By way of another example, the dielectric layers may be fabricated by mounting an integrated circuit component to the substrate using a dielectric adhesive (e.g. die attach) where a portion of the die attach extends beyond the perimeter of and potentially up a side of the integrated circuit component (e.g. a fillet). Accordingly, interconnects may be printed on the dielectric adhesive.

Further, the dielectric layer may be formed from any combination of electrically insulating materials suitable for providing electrical isolation and a continuous surface suitable for printed interconnects such as, but not limited to, dielectric materials, carbon or any suitable allotrope, or dielectric nanoparticles (e.g. polytetrafluoroethylene (PTFE)). For example, the dielectric layer may include a silica-filled epoxy or a bismaleimide.

In some embodiments, insulating stack layers between IC components of an IC stack (e.g. as part of an MCM device) may be, but are not required to be fabricated using the same processes as the dielectric layers. In this regard, the dielectric layers and the insulating stack layers may be fabricated simultaneously or in sequential processing steps. Further, the insulating stack layers may be formed from the same electrically insulating materials as the dielectric layers. For example, the insulating stack layers and/or the dielectric layers may be formed from a die-attach film or paste. In this regard, a physical distinction between insulating stack layers and dielectric layers may not be present.

An electrical device configured in accordance with innovative concepts disclosed herein may include a covering to seal and/or protect the IC components and printed interconnects. For example, a covering may include, but is not limited to, an overmolding layer, an encapsulation layer, an additional coating (e.g. a dielectric coating), or hermetic packaging. Accordingly, an electrical device configured in accordance with innovative concepts disclosed herein may but suitable for a range of applications such as, but not limited to, aeronautic applications or military applications.

Figure 1B:
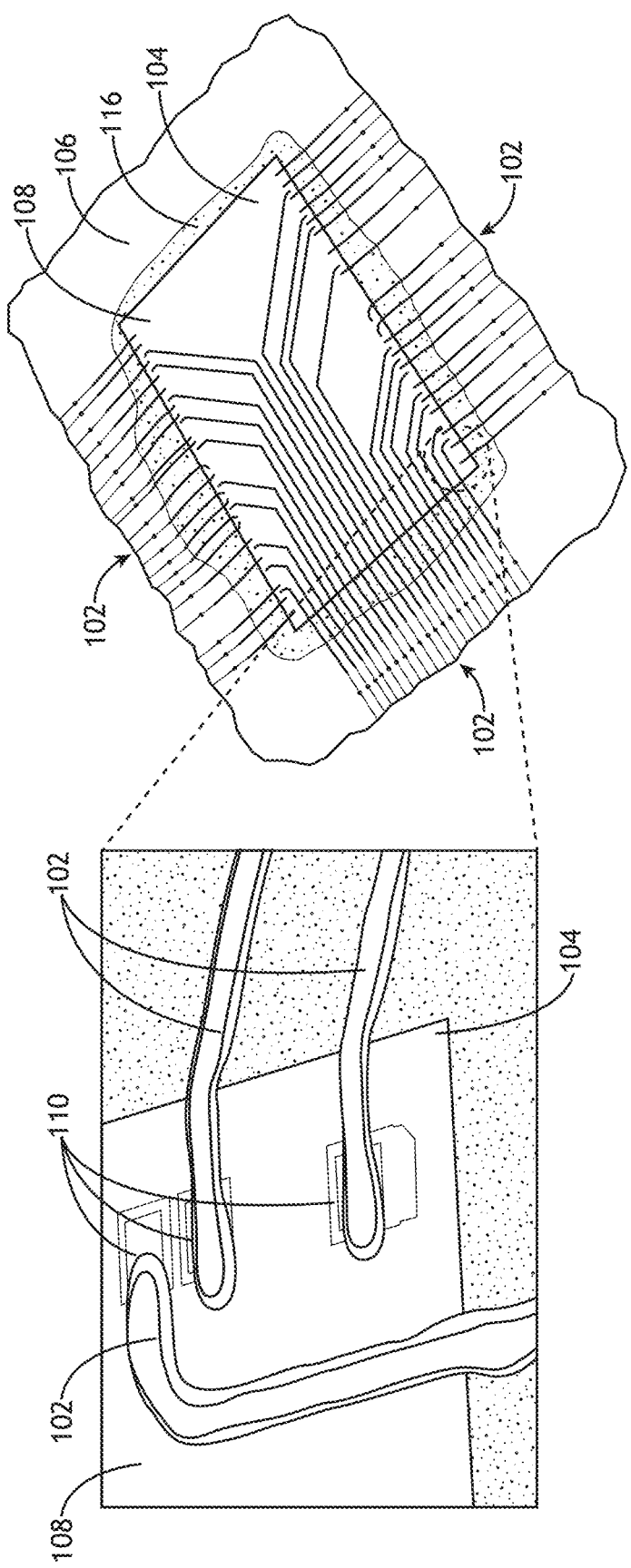
FIG. 1B is a perspective view of an exemplary embodiment of an electrical device with printed interconnects configured in accordance with one or more embodiments of the inventive concepts disclosed herein.

Referring now to FIGS. 1A-1B, an exemplary embodiment of an electrical device 100 with printed interconnects 102 configured in accordance with one or more embodiments of the inventive concepts disclosed herein is shown. FIG. 1A is a profile view of electrical device 100, FIG. 1B is a perspective view of electrical device 100.

The electrical device 100 may include an IC component 104 mounted to a substrate 106. The IC component 104 may include a terminal face 108 with component electrical terminals 110 (e.g. contact pads) to provide electrical connections to various internal electrical components. The IC component 104 may further include a mounting face 112 opposite the terminal face 108. In this regard, the mounting face 112 of an IC component 104 may be physically secured within an electrical device (e.g. to the substrate as illustrated in FIG. 1) and the terminal face 108 may be exposed to expose the component electrical terminals 110. The IC component 104 may be mounted to the substrate 106 using any technique suitable for securing the IC component 104. For example, the IC component 104 may be, but is not required to be mounted using an adhesive or solder.

In some embodiments, the electrical device 100 includes printed interconnects 102 fabricated with a printing technique as described previously herein to provide an electrical connection between component electrical terminals 110 of the IC component 104 and substrate electrical terminals 114 of the substrate 106.

In some embodiments, the electrical device 100 includes a dielectric layer 116 to provide a continuous surface between the substrate 106 and the terminal face 108 of the IC component 104. For example, the dielectric layer 116 may be fabricated along at least a portion of a perimeter of the IC component 104. Further, as illustrated in FIG. 1, the dielectric layer 116 may extend at least partially up a side face 118 of the IC component 104.

Accordingly, as illustrated in FIGS. 1A-1B, a path of a printed interconnect 102 may include any combination of a portion of a component electrical terminal 110, a portion of the terminal face 108, a portion of the side face 118, a portion of the dielectric layer 116, a portion of the substrate 106, or a portion of a substrate electrical terminal 114.

As described previously herein, the continuous surface between the substrate 106 and the terminal face 108 of the IC component 104 provided by the dielectric layer 116 may have any selected surface profile suitable for fabricating the printed interconnects 102. For example, as illustrated in FIG. 1, the dielectric layer 116 may provide, but is not required to provide, a smooth curved surface from the terminal face 108 to the substrate electrical terminals 114 to facilitate the fabrication of the printed interconnects 102.

Further, printed interconnects 102 fabricated in accordance with the inventive concepts disclosed herein may provide efficient packing of IC components 104 on a substrate 106. For example, a fan-out, or a distance between an edge of an IC component 104 and a substrate electrical terminal 114 along a direction parallel to the substrate 106 may be, but is not required to be, equal to or less than approximately 0.5 millimeters. By way of another example, an electrical device 100 fabricated in accordance with the inventive concepts disclosed herein may include a redistribution layer (RDL) to redistribute electrical terminals. In some embodiments, printed interconnects 102 fabricated in accordance with the inventive concepts disclosed herein may be printed on any surface (e.g. the substrate 106, a dielectric layer 116, or an IC component 104) such that a separate RDL may be unnecessary, which may reduce fabrication costs and facilitate modular fabrication.

Figure 2:
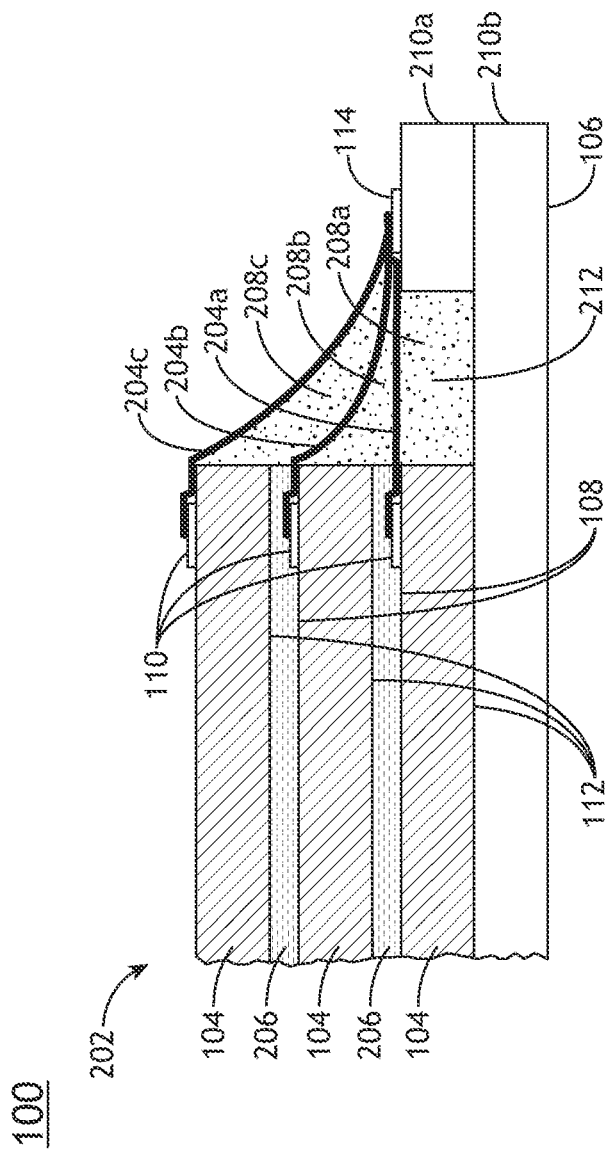
FIG. 2 is a profile view of an exemplary embodiment of an electrical device with printed interconnects connected to an IC stack with multiple IC components configured in accordance with one or more embodiments of the inventive concepts disclosed herein.

Referring now to FIG. 2, a profile view of an exemplary embodiment of an electrical device 100 with printed interconnects connected to an IC stack with multiple IC components configured in accordance with one or more embodiments of the inventive concepts disclosed herein is shown. The electrical device 100 may include an IC stack 202 including multiple stacked IC components 104. The electrical device 100 may further include printed interconnects 204a-204c providing an electrical connection between substrate electrical terminals 114 and component electrical terminals 110 of the IC components 104. The printed interconnects 204a-204c may be implemented and may function substantially similarly to the printed interconnects 102.

The multiple stacked IC components 104 of the IC stack 202 may be separated by insulating stack layers 206. For example, insulating stack layers 206 may be located between a terminal face 108 of one IC component 104 and a mounting face 112 of another IC component 104. In this regard, an insulating stack layer 206 may cover and electrically isolate exposed portions of component electrical terminals 110 as well as portions of the printed interconnects 204a-204c. Accordingly, an IC stack 202 may include any number of IC components 104.

An electronic device including an IC stack fabricated in accordance with inventive concepts disclosed herein may facilitate a high vertical density of stacked IC components. In this regard, insulating stack layers may be fabricated with any thickness. For example, insulating stack layers may be, but are not required to be, fabricated with a thickness in the range of approximately 10-40 micrometers. Further, electronic devices fabricated in accordance with inventive concepts disclosed herein may include IC components with any thickness. In particular, the fabrication of interconnects through a non-contact printing process in accordance with inventive concepts disclosed herein may facilitate the use of mechanically sensitive IC components such as, but not limited to, IC components having a thickness less than approximately 100 micrometers.

An electronic device including an IC stack fabricated in accordance with inventive concepts disclosed herein may further include multiple dielectric layers to provide continuous surfaces from the substrate to terminal faces of the IC components of the IC stack. For example, as illustrated in FIG. 2, electrical device 100 may include a first dielectric layer 208a to provide a continuous surface from the substrate 106 for a first printed interconnect 204a, a second dielectric layer 208b to provide a continuous surface from the substrate 106 for a second printed interconnect 204b, and a third dielectric layer 208c to provide a continuous surface from the substrate 106 for a third printed interconnect 204c. The first dielectric layer 208a, the second dielectric layer 208b, and the third dielectric layer 208c may be implemented and may function substantially similarly to the dielectric layer 116.

In some embodiments, one or more IC components 104 are mounted within a pocket or depression such that a gap may be present between the perimeter of an IC component 104 and a portion of the substrate 106 having electrical terminals. For example, as illustrated in FIG. 2, the substrate 106 may include a top substrate layer 210a and a lower substrate layer 210b arranged such that at least one IC component 104 is nested or embedded at least partially within the substrate 106. Further, the dielectric layer may fill the gap 212 and provide a continuous surface for printed interconnect 204a as well as support for additional dielectric layers 208b,208c.

In some embodiments, the insulating stack layers 206 are formed from the same electrically insulating material as the dielectric layers 208a-208c. Further, the insulating stack layers 206 may be, but are not required to be, fabricated using the same fabrication process as the dielectric layers 208a-208c. In this regard, a physical distinction between insulating stack layers 206 and dielectric layers 208a-208c may not be present.

An electronic device fabricated in accordance with inventive concepts disclosed herein may include IC components having any size. Further, the sizes of IC components (e.g. IC components within an IC stack) may have different sizes. For example, one or more IC components may create an overhang by extending, in a direction parallel to the substrate, beyond additional device components such as, but not limited to, a portion of the substrate or additional IC components closer to the substrate. Accordingly, a dielectric layer of the electronic device may fill the overlapping portion of the integrated circuit component and further extend beyond the perimeter of the overhanging IC component to provide a continuous surface for printed interconnects.

Figure 3:
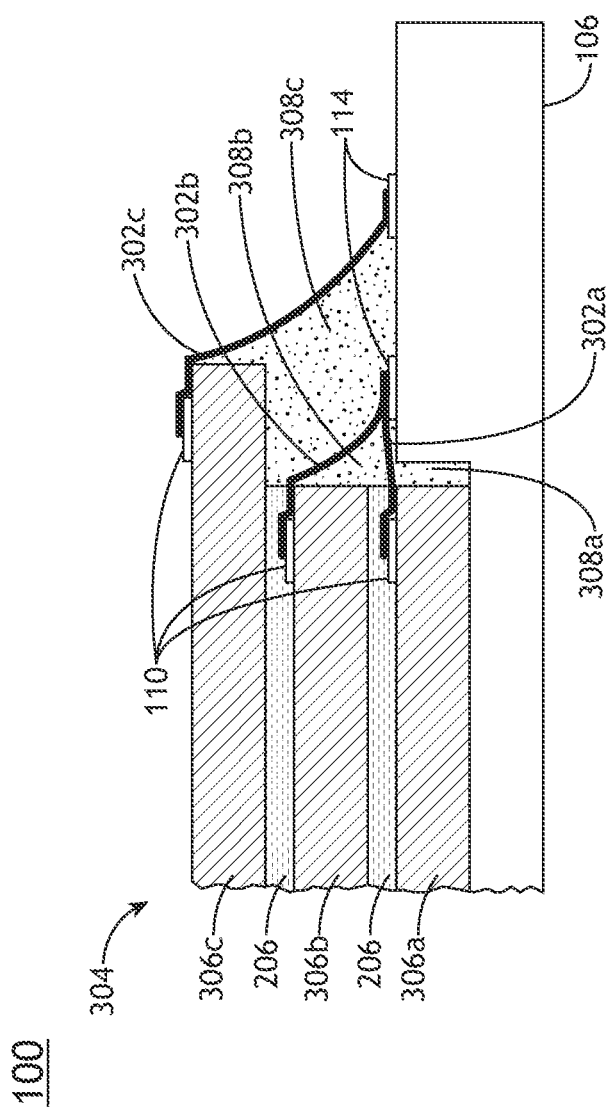
FIG. 3 is a profile view of an exemplary embodiment of an electrical device 100 with printed interconnects connected to an IC stack forming an overhang configured in accordance with one or more embodiments of the inventive concepts disclosed herein.

Referring now to FIG. 3, a profile view of an exemplary embodiment of an electrical device 100 with printed interconnects 302a-302c connected to an IC stack 304 forming an overhang configured in accordance with one or more embodiments of the inventive concepts disclosed herein is shown. The IC stack 304 may be implemented and may function substantially similarly to IC stack 202, except that the IC stack 304 includes overhanging components. For example, The IC stack 304 may include IC components 306a-306c that may be implemented and may function substantially similarly to the IC components 104 of IC stack 202, except that overhanging IC component 306c extends beyond a portion of the substrate 106 as well as lower IC components 306a,306b.

Accordingly, the electrical device 100 may include dielectric layers to provide continuous surfaces from the component electrical terminals 110 of the IC stack 304 to the substrate 106. For example, a first dielectric layer 308a provides a continuous surface for a first printed interconnect 302a, a second dielectric layer 308b provides a continuous surface for a second printed interconnect 302b, and a third dielectric layer 308c provides a continuous surface for a third printed interconnect 302c. In this regard, the third dielectric layer 308c may fill the portion of electrical device 100 underneath the overhanging IC component 306c to further support the overhanging IC component 306c. Additionally, the printed interconnect 302a-302c may be implemented and may function substantially similarly to the printed interconnects 102.

Figure 4:
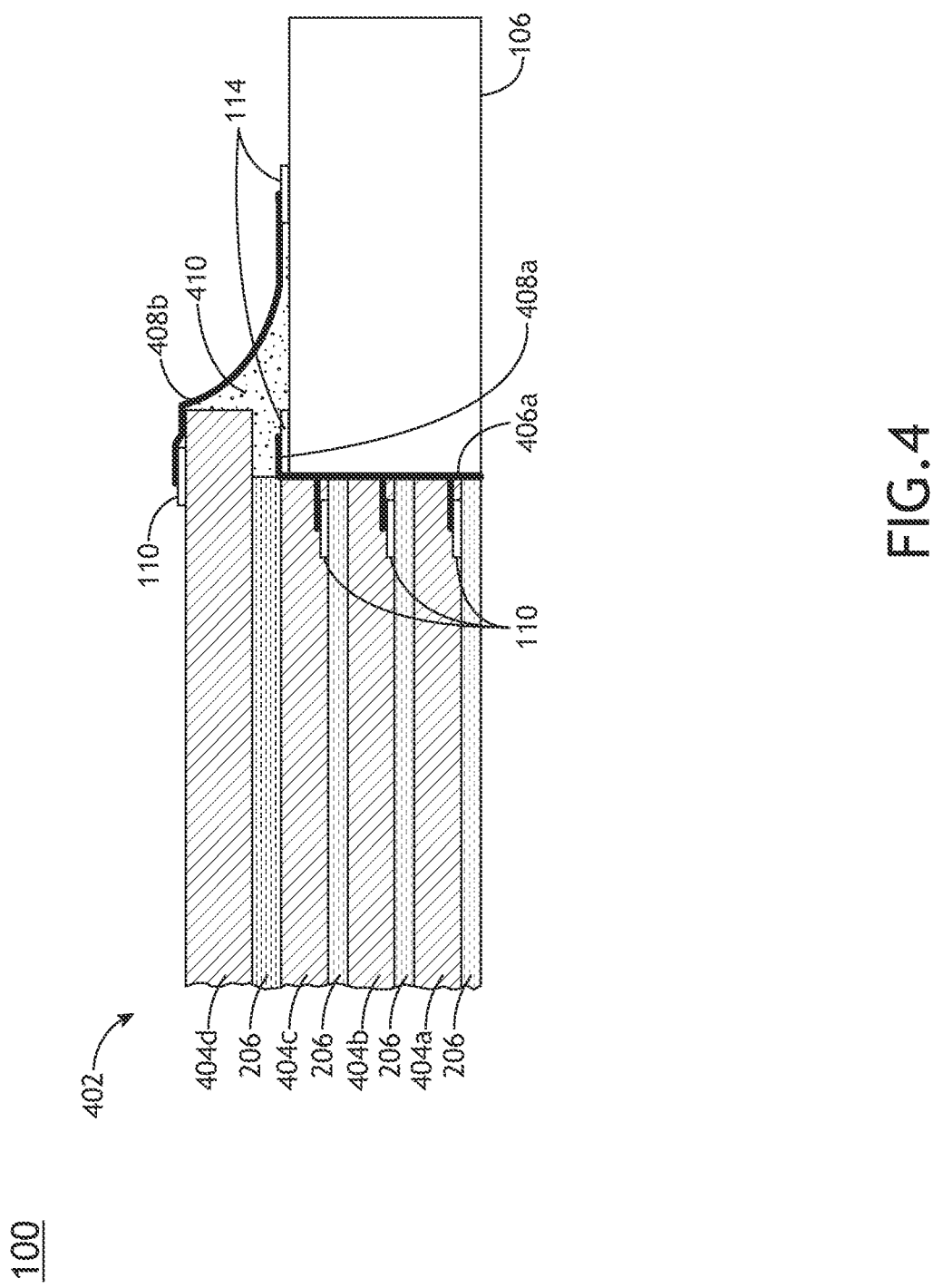
FIG. 4 is a profile view of an exemplary embodiment of an electrical device with printed interconnects connected to an IC stack having a unified serial bus and an overhanging IC component configured in accordance with one or more embodiments of the inventive concepts disclosed herein.

Referring now to FIG. 4, a profile view of an exemplary embodiment of an electrical device 100 with printed interconnects connected to an IC stack having a unified serial bus and an overhanging IC component configured in accordance with one or more embodiments of the inventive concepts disclosed herein is shown. The electrical device 100 may include an IC stack 402 including IC components 404a-404d that may implemented and may function substantially similarly to IC stack 304 except that IC stack 402 may include a unified serial bus 406 providing a common electrical connection with component electrical terminals 110 on IC components 404a-404c beneath overhanging IC component 404d. The electrical device 100 may further include a first printed interconnect 408a to connect a substrate electrical terminal 114 to the unified serial bus 406 and a second printed interconnect 408b to connect a substrate electrical terminal 114 to a component electrical terminal 110 on the overhanging IC component 404. Further, the electrical device 100 may include a dielectric layer 410 to provide a continuous surface for the second printed interconnect 408b and fill beneath the overhanging IC component 404 that may be implemented and may function substantially similarly to dielectric layer 308c. Accordingly, an electronic device fabricated in accordance with inventive concepts disclosed herein may provide high-density vertical and horizontal integration of components.

Figure 5:
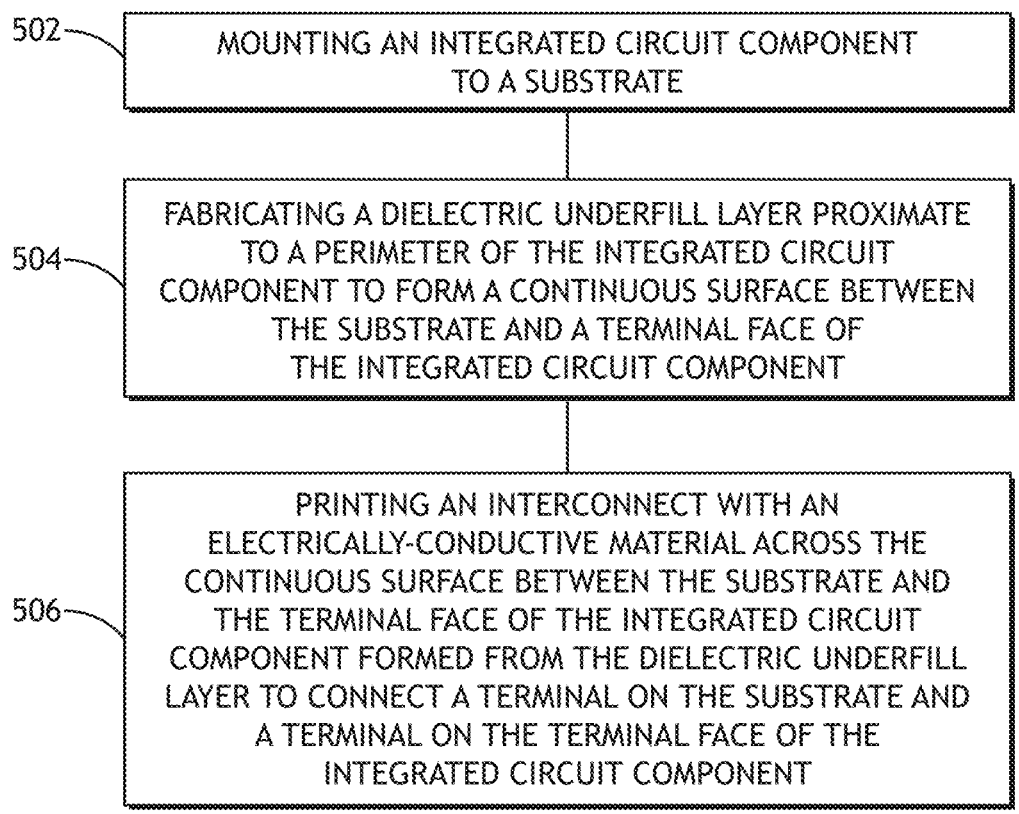
FIG. 5 is an exemplary embodiment of a method according to the inventive concepts disclosed herein.

Referring now to FIG. 5, an exemplary embodiment of a method according to the inventive concepts disclosed herein may include one or more of the following steps. The method 500 may be utilized to provide printed interconnects for electrical devices. The embodiments and enabling technologies described previously herein in the context of an electrical device 100 should be interpreted to extend to method 500. However, the method 500 is not limited to the architecture of the electrical device 100.

A step 502 may include mounting an IC component to a substrate. For example, the IC component may be mounted to the substrate using an adhesive or solder to physically secure the IC component to the substrate. A step 504 may include fabricating a dielectric layer proximate to a perimeter of the IC component to form a continuous surface between the substrate and a terminal face of the IC component. Accordingly, the dielectric layer may provide a desired surface profile suitable for printing interconnects. Further, the dielectric layer may provide electrical insulation for printed interconnects. A step 506 may include printing an interconnect with an electrically-conductive material across the continuous surface between the substrate and the terminal face of the IC component formed from the dielectric layer (e.g. fabricated in step 504) to connect a terminal on the substrate and a terminal on the terminal face of the IC component. Thus, the printed interconnect may provide an electrical connection between the substrate and the IC component to integrate the IC component within an electrical device. In some embodiments, the dielectric layer is fabricated using the same or a similar printing technique used to print interconnects in step 506.

An IC component may include any number of component electrical terminals providing electrical connections to internal electrical components. Accordingly the method 500 may include printing any number of interconnects to connect various component electrical terminals with each other or terminals of the substrate.

Further, the method 500 may include fabricating stacked IC structures to provide MCM devices. For example, the method 500 may further include fabricating an insulating stack layer on the terminal face of the IC component, mounting an additional IC component to the insulating stack layer, fabricating an additional dielectric layer to provide a continuous surface between the substrate and a terminal face of the additional IC component, and printing one or more additional interconnects between the terminals on the substrate and terminals on the additional IC component. In this regard, the method 500 may include fabricating devices including any number of stacked IC structures.

It is to be understood that embodiments of the methods according to the inventive concepts disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

From the above description, it is clear that the inventive concepts disclosed herein are well adapted to carry out the objects and to attain the advantages mentioned herein as well as those inherent in the inventive concepts disclosed herein. While presently preferred embodiments of the inventive concepts disclosed herein have been described for purposes of this disclosure, it will be understood that numerous changes may be made which will readily suggest themselves to those skilled in the art and which are accomplished within the broad scope and coverage of the inventive concepts disclosed and claimed herein.

What is claimed:

1. A device, comprising:
a substrate including a cavity in a top face; two or more integrated circuit components forming a stack, the two or more integrated circuit components of the stack connected by one or more insulating stack layers, the stack mounted to a floor of the cavity of the substrate; and
one or more printed interconnects each comprising a layer of electrically-conducting material providing an electrical connection between an electrical terminal on the top face of the substrate and an electrical terminal on a terminal face of each of the two or more integrated circuit components of the stack, wherein each of the one or more printed interconnects is formed via selective deposition of the material exclusively using additive manufacturing onto one or more portions of each of the electrical terminal on the terminal face of each the two or more integrated circuit components, the terminal face of each of the two or more integrated circuit components, at least one of one or more dielectric layers, and the electrical terminal on the substrate, wherein each of the one or more printed interconnects is in contact with the one or more portions of each of the electrical terminal on the terminal face of each the two or more integrated circuit components, the terminal face of each of the two or more integrated circuit components, at least one of one or more dielectric layers, and the electrical terminal on the substrate, wherein the one or more dielectric layers provide a continuous surface between the top face of the substrate and the terminal face of at least one of the two or more integrated circuit components; and a common printed interconnect comprising a layer of material providing an electrical connection between a common electrical terminal on the substrate and at least one electrical terminal on each of the two or more integrated circuit components, wherein the common printed interconnect is formed along a side of the stack via selective deposition of the material exclusively using additive manufacturing onto one or more portions of each of the common electrical terminal, the two or more integrated circuit components, and at least one of the one or more dielectric layers, wherein the common printed interconnect forms a pattern configured such that the common printed interconnect is in contact with the one or more portions of each of the common electrical terminal, the two or more integrated circuit components, and at least one of the one or more dielectric layers.

2. The device of claim 1, wherein a first integrated circuit component of the stack is larger than a second integrated circuit component of the stack along a direction parallel to the substrate.

3. The device of claim 1, wherein at least one of the one or more printed interconnects comprises:
at least one of a nanoparticulate ink, a liquid semiconductor material, or a paste.

4. The device of claim 1, wherein central axes of the two or more integrated circuit components of the stack along a direction normal to the substrate are aligned.

5. A method, comprising:
mounting a first integrated circuit component to a substrate;
fabricating a first dielectric layer proximate to a perimeter of the first integrated circuit component to form a continuous surface between the substrate and a terminal face of the first integrated circuit component; and
printing a first interconnect via selective deposition of electrically-conducting material exclusively using additive manufacturing along a first path between a first electrical terminal on the terminal face of the first integrated circuit component and a second electrical terminal on the substrate to provide an electrical connection exclusively between the first electrical terminal and the second electrical terminal, wherein the first interconnect is in contact with one or more portions of each of the first electrical terminal, the terminal face of the first integrated circuit component, the first dielectric layer, and the second electrical terminal, wherein the first dielectric layer provides the continuous surface between the substrate and the terminal face of the first integrated circuit component;
fabricating an insulating stack layer on the terminal face of the first integrated circuit component, wherein the insulating stack layer covers at least a portion of the first interconnect disposed on the terminal face of the first dielectric layer;
mounting a second integrated circuit component to the insulating stack layer, wherein the second integrated circuit component is disposed on the portion of the first interconnect covered by the insulating stack layer;
fabricating a second dielectric layer proximate to a perimeter of the second integrated circuit component to form a continuous surface between the substrate and a terminal face of the second integrated circuit component; and
printing a second interconnect via selective deposition of electrically-conducting material exclusively using additive manufacturing along a second path between a third electrical terminal on the terminal face of the second integrated circuit component and a fourth electrical terminal on the substrate to provide an electrical connection exclusively between the third electrical terminal and the fourth electrical terminal, wherein the second interconnect is in contact with one or more portions of each of the third electrical terminal, the terminal face of the second integrated circuit component, the second dielectric layer, and the fourth electrical terminal, wherein the second dielectric layer provides the continuous surface between the substrate and the terminal face of the second integrated circuit component.

6. The method of claim 5, wherein printing the first interconnect via selective deposition of electrically-conducting material exclusively using additive manufacturing along the first path comprises:
printing the first interconnect via selective deposition of electrically-conducting material along the first path using a non-contact jet process, and wherein printing the second interconnect via selective deposition of electrically-conducting material exclusively using additive manufacturing along the second path comprises:
printing the second interconnect with the non-contact jet process.

7. The method of claim 6, wherein printing the first interconnect via selective deposition of electrically-conducting material along the first path using a non-contact jet process comprises:
atomizing an electrically-conducting interconnect material; and
projecting the atomized interconnect material as the substrate is translated along the first path to form the first interconnect;
wherein printing the second interconnect via selective deposition of electrically-conducting material along the first path using a non-contact jet process comprises:
projecting the atomized interconnect material as the substrate is translated along the first path to form the second interconnect.

8. The method of claim 6, wherein at least one of the first interconnect or the second interconnect has a width equal to or less than 10 micrometers.

9. The method of claim 5, wherein mounting the first integrated circuit component to the substrate comprises:
mounting the first integrated circuit component to a floor of a cavity in a top face of the substrate, wherein the first electrical terminal is disposed on the top face of the substrate, wherein the first dielectric layer fills at least a portion of the cavity surrounding the first integrated circuit component.

10. The method of claim 5, wherein printing the first interconnect via selective deposition of electrically-conducting material exclusively using additive manufacturing along the first path comprises:
printing the first interconnect via an inkjet printing process, wherein printing the second interconnect via selective deposition of electrically-conducting material exclusively using additive manufacturing along the second path comprises:
printing the second interconnect via the inkjet printing process.

11. The method of claim 5, wherein printing the first interconnect via selective deposition of electrically-conducting material exclusively using additive manufacturing along the first path comprises:

printing the first interconnect via an extrusion printing process, wherein printing the second interconnect via selective deposition of electrically-conducting material exclusively using additive manufacturing along the second path comprises:
  printing the second interconnect via the extrusion printing process.

12. The method of claim 5, wherein printing the first interconnect via selective deposition of electrically-conducting material exclusively using additive manufacturing along the first path comprises:
  printing the first interconnect via a laser-based additive manufacturing process, wherein printing the second interconnect via selective deposition of electrically-conducting material exclusively using additive manufacturing along the second path comprises:
    printing the second interconnect via the laser-based additive manufacturing process.

13. A device, wherein the device is formed by:
  mounting a first integrated circuit component to a substrate;
  fabricating a first dielectric layer proximate to a perimeter of the first integrated circuit component to form a continuous surface between the substrate and a terminal face of the first integrated circuit component; and
  printing a first interconnect via selective deposition of electrically-conducting material exclusively using additive manufacturing along a first path between a first electrical terminal on the terminal face of the first integrated circuit component and a second electrical terminal on the substrate to provide an electrical connection exclusively between the first electrical terminal and the second electrical terminal, wherein the first interconnect is in contact with one or more portions of each of the first electrical terminal, the terminal face of the first integrated circuit component, the first dielectric layer, and the second electrical terminal, wherein the first dielectric layer provides the continuous surface between the substrate and the terminal face of the first integrated circuit component;
  fabricating an insulating stack layer on the terminal face of the first integrated circuit component, wherein the insulating stack layer covers at least a portion of the first interconnect disposed on the terminal face of the first dielectric layer;
  mounting a second integrated circuit component to the insulating stack layer, wherein the second integrated circuit component is disposed on the portion of the first interconnect covered by the insulating stack layer;
  fabricating a second dielectric layer proximate to a perimeter of the second integrated circuit component to form a continuous surface between the substrate and a terminal face of the second integrated circuit component; and
  printing a second interconnect via selective deposition of electrically-conducting material exclusively using additive manufacturing along a second path between a third electrical terminal on the terminal face of the second integrated circuit component and a fourth electrical terminal on the substrate to provide an electrical connection exclusively between the third electrical terminal and the fourth electrical terminal, wherein the second interconnect is in contact with one or more portions of each of the third electrical terminal, the terminal face of the second integrated circuit component, the second dielectric layer, and the fourth electrical terminal, wherein the second dielectric layer provides the continuous surface between the substrate and the terminal face of the second integrated circuit component.

14. The device of claim 13, wherein printing the first interconnect via selective deposition of electrically-conducting material exclusively using additive manufacturing along the first path comprises:
  printing the first interconnect via selective deposition of electrically-conducting material along the first path using a non-contact jet process, and wherein printing the second interconnect via selective deposition of electrically-conducting material exclusively using additive manufacturing along the second path comprises:
    printing the second interconnect with the non-contact jet process.

15. The device of claim 14, wherein at least one of the first interconnect or the second interconnect has a width equal to or less than 10 micrometers.

16. The device of claim 13, wherein printing the first interconnect via selective deposition of electrically-conducting material exclusively using additive manufacturing along the first path comprises:
  printing the first interconnect via an inkjet printing process, wherein printing the second interconnect via selective deposition of electrically-conducting material exclusively using additive manufacturing along the second path comprises:
    printing the second interconnect via the inkjet printing process.

17. The device of claim 13, wherein printing the first interconnect via selective deposition of electrically-conducting material exclusively using additive manufacturing along the first path comprises:
  printing the first interconnect via an extrusion printing process, wherein printing the second interconnect via selective deposition of electrically-conducting material exclusively using additive manufacturing along the second path comprises:
    printing the second interconnect via the extrusion printing process.

18. The device of claim 13, wherein printing the first interconnect via selective deposition of electrically-conducting material exclusively using additive manufacturing along the first path comprises:
  printing the first interconnect via a laser-based additive manufacturing process, wherein printing the second interconnect via selective deposition of electrically-conducting material exclusively using additive manufacturing along the second path comprises:
    printing the second interconnect via the laser-based additive manufacturing process.

19. The device of claim 13, wherein mounting the first integrated circuit component to the substrate comprises:
  mounting the first integrated circuit component to a floor of a cavity in a top face of the substrate, wherein the first electrical terminal is disposed on the top face of the substrate, wherein the first dielectric layer fills at least a portion of the cavity surrounding the first integrated circuit component.

20. The device of claim 13, wherein central axes of the first integrated circuit component and the second integrated circuit component along a direction normal to the substrate are aligned.

* * * * *